US006563714B2

(12) United States Patent
Chang

(10) Patent No.: US 6,563,714 B2
(45) Date of Patent: May 13, 2003

(54) MOBILE RACK WITH IDE AND USB INTERFACES

(76) Inventor: Cheng-Chun Chang, 11F-2, No. 11, Lane 202, Jing-Shing Road, Wen-Shan DT, Taipei (TW)

( * ) Notice: Subject to any disclaimer, the term of this patent is extended or adjusted under 35 U.S.C. 154(b) by 0 days.

(21) Appl. No.: 09/983,374

(22) Filed: Oct. 24, 2001

(65) Prior Publication Data

US 2002/0035657 A1 Mar. 21, 2002

(30) Foreign Application Priority Data

Sep. 4, 2000 (TW) ..................................... 90215116 U

(51) Int. Cl.[7] ............................ H05K 5/00; H05K 5/04; H05K 5/06

(52) U.S. Cl. ........................ 361/752; 361/753; 361/788; 361/727; 361/728; 361/724; 361/803; 361/796

(58) Field of Search ................................. 361/752, 753, 361/825, 685, 725, 726, 727, 788, 803, 796, 728, 724

(56) References Cited

U.S. PATENT DOCUMENTS 4,941,841 A * 7/1990 Darden et al. .............. 439/377
6,231,145 B1 * 5/2001 Liu .......................... 312/332.1

* cited by examiner

*Primary Examiner*—David Martin
*Assistant Examiner*—Thanh Yen Tran
(74) *Attorney, Agent, or Firm*—Troxell Law Office PLLC

(57) ABSTRACT

A mobile rack with IDE and USB interfaces comprises an outer frame, and an outer circuit board. The outer frame has a central frame chamber. The outer circuit board is attached to the rear side of the outer frame with a 40-pin IDE interface connector and a power input socket at the outer side thereof respectively. It is characterized in that the outer circuit board at the outer side thereof further provides a first USB signal connector so as to admit a signal being converted and integrated at a 50-pin outer signal connector disposed at the inner side of the outer circuit board; a power line between the outer signal connector and the power input socket connects with a switch on the outer frame for controlling an outer power source disconnecting from/connecting with the outer signal connector; a +data and a −data signals in the first USB signal connector connect with two vacant pins in the outer signal connectors and the rest pins in the first signal USB signal connector including a +5V and two grounded lines are connected to corresponding pins in the outer signal connector in parallel to make the outer signal connector have a IDE interface and a USB interface respectively for a data storage device with a IDE interface or a USB periphery device with a USB interface contained in a rack chamber of the inner rack being run well.

6 Claims, 3 Drawing Sheets

MOBILE RACK WITH IDE AND USB INTERFACES

BACKGROUND OF THE INVENTION

1. Field of the Invention

The present invention relates to a computer mobile rack, and, particularly, to a mobile rack with IDE and USB interfaces, which is possible for a user to change a data storage device with a IDE interface or a USB periphery device with a USB interface as desired by way of replacing the inner rack.

2. Description of Related Art

Due to a rapid development of information technology, the computer hardware has occurred a revolutionary change to adapt to all kinds of variances. For instance, a hard disk was fixed inside the casing of computer main unit during the earlier period. In order to reserve or copy the data and even to consider the portability and the security of the confidential data, the so-called mobile rack for a hard disk was developed to meet the need and it brings a great convenience to the user. In fact, the periphery device received in the inner rack of the mobile rack may be a zip disk drive with a IDE interface, a magneto-optical disk drive (MO), a magnetic tape unit, or a flash memory card read (a read and write device of flash memory in a digital camera) in addition to the hard disk so that the practicability of the mobile rack can be broadened more widely.

A conventional mobile rack is composed of an outer frame and an inner rack, wherein, the outer frame provides an outer circuit board, which has a 40-pin female connector with a standard IDE interface and a power source input socket at the outer side thereof respectively, so as to convert signals to a 50-pin male signal connector at the inner side thereof. Thus, signals at a +5V and a +12V power source lines and at two grounded lines in the power input socket can be converted to eight pins in the male signal connector. For instance, +5V power source lines are output in parallel from the 43rd and the 44th pins, +12V power source lines are output in parallel from the 49th and 50th pins, and the two grounded lines are output in parallel from the 45th to the 48th pins. As a result, the male signal connector still has two vacant pins left such as the 41st and the 42nd pins. The inner rack at the rear side thereof has an inner circuit board and the inner circuit board at the outer side thereof has a female signal connector for being inserted by the male signal connector as soon as the inner rack is inserted into the outer frame so that the signals can be transformed to the inner circuit board completely. Further, the inner circuit board at the inner side thereof divides the signals into a 40-pin male connector with a standard IDE interface and a power source output respectively so as to connect the preceding data storage device with an IDE interface such as a hard disk for the data storage device being able to run smoothly.

However, due to the USB periphery device with a USB interface such as an external type USB hub, a USB modem, and etc. being developed incessantly and the USB periphery device being connected to the rear side of the main unit usually, it is very inconvenient to the user and becomes a puzzle to a user that the USB periphery device has to be attached to the rear side of the main unit while in use and has to be detached while not in use. From the view point of interface transmission for a USB periphery device, it is composed of a +5V power source line, a +data signal line, a −data signal line, and two grounded lines, wherein, the power source line and the two grounded lines are provided on the outer circuit board and the inner circuit board except the +data and the −data signal lines. Thus, how to integrate the IDE interface and the USB interface for facilitating a device with IDE interface or a device with USB interface being connected to the main unit by way of replacing the inner rack is a hard subject has to be overcome by the manufacturer.

It is known that a mobile rack available in the market has equipped a hub with a USB interface and the male signal connector at the outer frame has a circuit layout with the +data and the −data signal lines at output ends of the USB interface being connected to two vacant pins such as the 41st and the 42nd pins. Then, the USB interface output ends of the main board have a +5V power source to be connected to the 44th pin, the +5V power source at the original power input socket is connected to the 43rd pin, the 46th pin is connected to the grounded line of the USB interface output end on the main board, and the 45th, the 47th, and the 48th pins are output in parallel with two grounded lines in the original power input socket. Although the preceding circuit layout basically can offer the mobile rack a function of USB interface, it is involved in a drawback that no switch is provided between the power source input socket and the signal connector of the outer frame. Accordingly, the power source of the computer main unit has to be shut down before the inner rack can be replaced in case of the original IDE interface or USB interface device being changed for another one. In this way, it is unable to reach a purpose that the IDE interface or the USB interface device can be run in spite of the main unit being in a state of on as soon as the inner rack is inserted into the outer frame. Furthermore, if the female signal connector of the inner rack provides a conventional pin layout and it is not possible to correspond to the USB interface of the outer frame, two +5V power sources at the 43rd and the 44th pins in the male signal connector of the outer frame may become short circuit while the inner rack is inserted into the outer frame and the USB interface output end of the main board may burned out because of a stronger current generated from the +5V power source of the 43rd pin directly connecting with the power supplier such that the USB interface output end on the main board may lose the function of transmission.

SUMMARY OF THE INVENTION

An object of the present invention is to provide a mobile rack with IDE and USB interfaces, which integrates the IDE interface and the USB interface to perform a function of a data storage device or a USB periphery device being run well immediately as soon as the inner rack is inserted into the outer frame with a high compatibility in spite of the main unit being in a state of on.

BRIEF DESCRIPTION OF THE DRAWINGS

The present invention can be more fully understood by referring to the following description and accompanying drawings, in which.

DETAILED DESCRIPTION OF THE PREFERRED EMBODIMENTS

Figure 1:
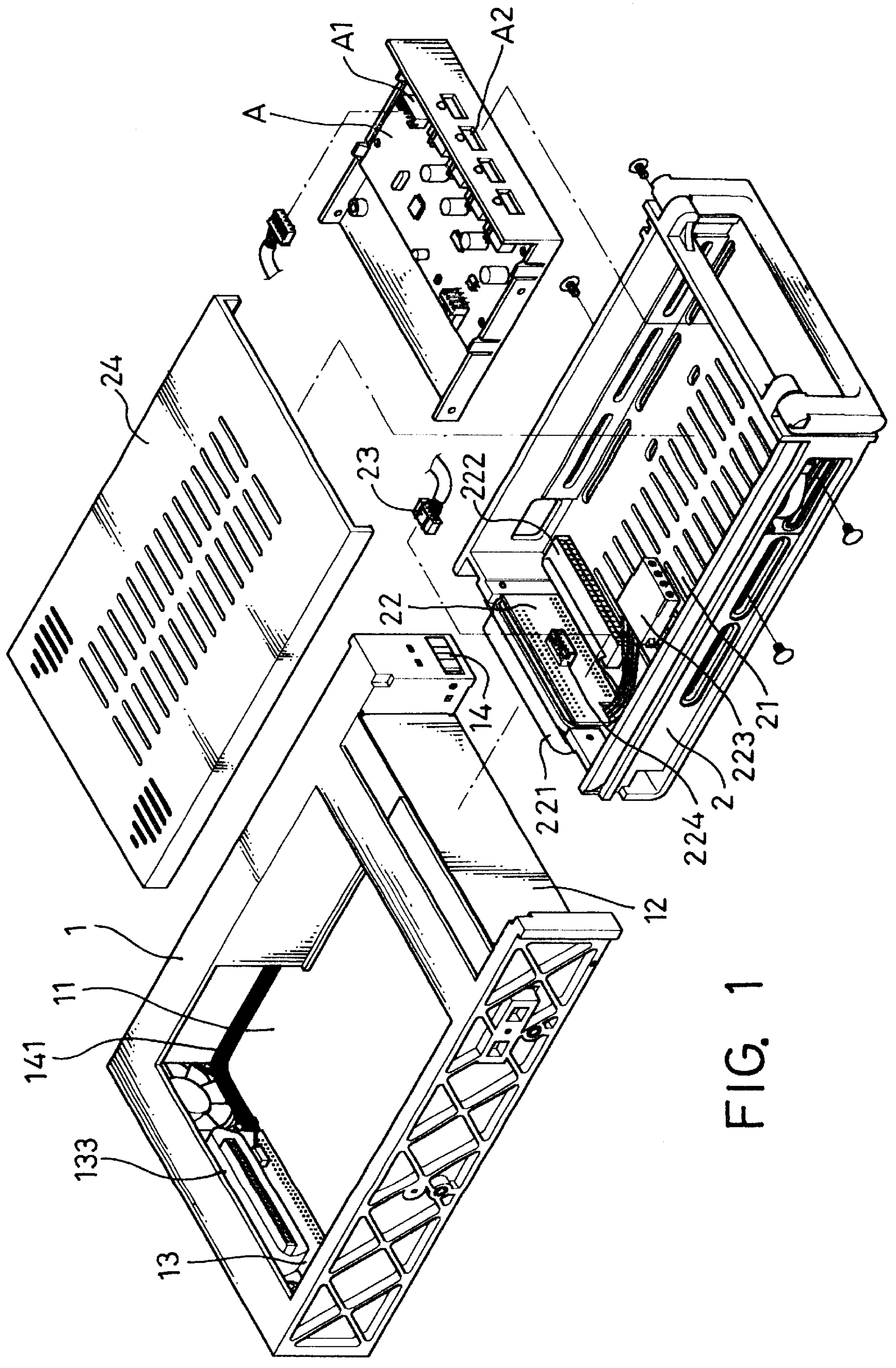
FIG. 1 is a perspective exploded view of a mobile rack with IDE and USB interfaces according to the present invention.
Figure 2:
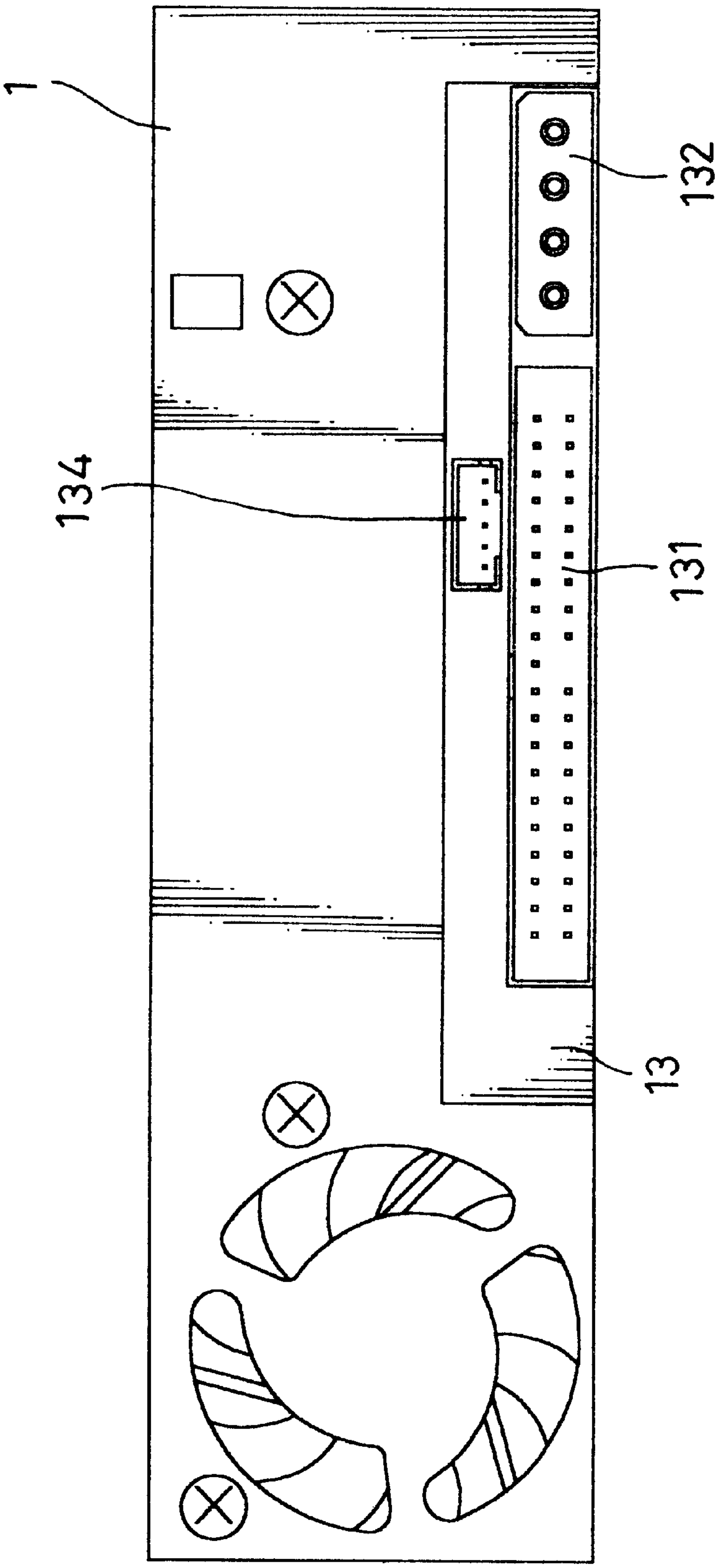
FIG. 2 is a rear view of an outer frame shown in FIG. 1.
Figure 3:
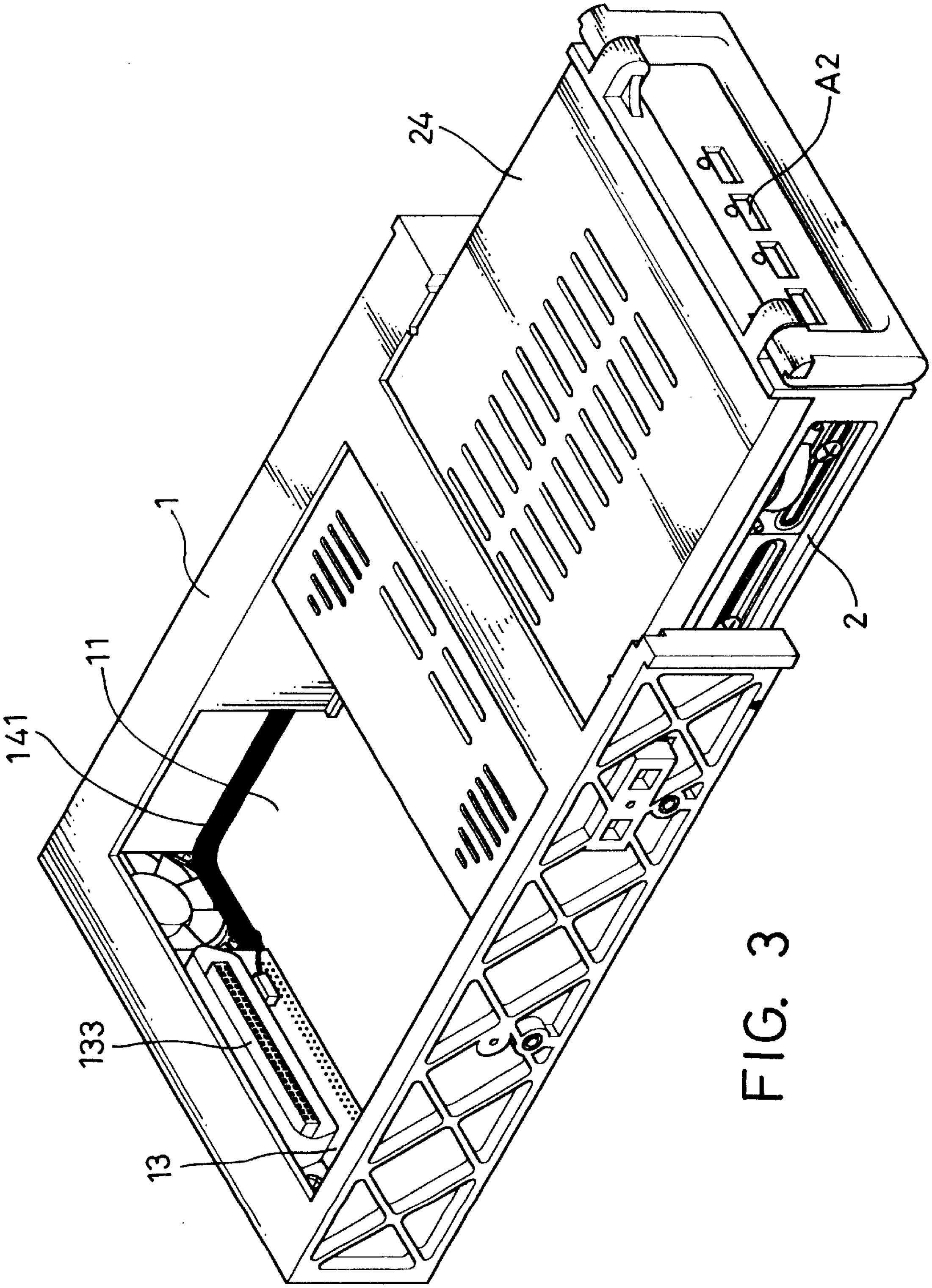
FIG. 3 is a perspective view of a mobile rack with IDE and USB interfaces according to the present invention.

Referring to FIGS. 1 to 3, a mobile rack with IDE and USB interfaces according to the present invention basically comprises an outer frame 1 and at least an inner rack 2.

Wherein, the outer frame 1 is a frame with a hollow space to be fixedly mounted to a preset 5.25' receiving space in a computer main unit. A flap gate 12 is disposed in front of a central chamber 11 and an outer circuit board 13 is disposed at the rear side of the outer frame 1 respectively. A female connector 131 with a standard IDE interface, which is provided with conventional 40 pins, and a power input socket 132 with +5V and +12V ports are disposed next to the circuit board 13 for being inserted with the wiring for connecting with the main board and the output plug of the power supplier respectively, which are belonged to the known art and not shown in the figures. The outer circuit board 13 at the inner side thereof outward extends a 50-pin outer signal connector 133, and a power line 141 is arranged between the signal connector 133 and the power input socket 132 to connect with a switch 14 on the facial side of the outer frame 1 such that the disconnection/connection of the external power can be controlled, and signals from the female connector 131 and the power output socket 132 respectively can be changed and integrated at the signal connector 133 via a circuit layout. It is noted that the pin designation of the output signal is identical with the conventional art and no detail will be described further.

Besides, a 5-pin first USB signal connector 134 is disposed in the outer circuit board 13 near an edge thereof and two grounded lines and a +5V power source connect with corresponding preset pins in the outer signal connector 133 such as the 45th to the 48th pins (grounded lines) and the 43rd and the 44th pins (+5V power sources) in parallel. A +data signal and a −data signal connect with two vacant pins of the outer signal connector 133 such as the 41st and the 42nd pins so that the outer signal connector 133 can offers input/output functions for the IDE interface. In addition, the USB signal connector 134 can be inserted to the output end of USB interface by way of a conventional USB signal line (not shown) to form a closed circuit.

The inner rack 2 has a size corresponding to the central frame chamber 11 and provides a central rack chamber 21 for receiving a data storage device such as a hard disk with a IDE interface, a ZIP disk drive, a magneto-optical disk drive (MO), a magnetic tape unit, or a flash memory card read, or receiving a periphery such as a USB hub, 10/100 ethernet card, a television (TV) box, a modem, or a flash memory card read. Further, the rack chamber 21 is closed with an upper cover 24. An inner circuit board 22 is disposed at the back of the rack chamber 21. The inner circuit board 22 at the outer side thereof has a 50-pin inner signal connector 22 and at the inner side thereof has a 40-pin IDE interface male connector 222 and a power output plug 223 for connecting with the preceding data storage device of IDE interface (this is a known art and no detail will be described further). The inner circuit board 22 differs the conventional art in that the inner side thereof further provides a second USB signal connector 224 and five pins of the second USB signal connector 224 connect with the +5V pin, the two ground line pins, and the +data and the −data pins respectively. For instance, the +data and the −data pins connect with the 41st and the 42nd pins of the inner signal connector 221, the +5V and the two grounded lines connect with the 45th to the 48th pins (grounded lines) and with the 43rd and 44th pins (+5V power source) such that the second USB signal connector 224 can provide functions of the power supply and the signal input/output.

Accordingly, when the rack chamber 21 receives a USB periphery device A such as a four port USB hub shown in FIG. 1, the USB interface hub can supply the source power and connect the signal as soon as a USB signal line 23 is inserted into the second USB signal connector 224 and the third USB signal connector A1 respectively. The user can connect any other USB periphery device to the computer as desired by way of a rocker USB plug, for instance, connecting with any USB socket A2 instead of inconveniently using the original USB socket at the rear side of the computer main unit.

When another USB periphery device is going to be replaced, it is only necessary to stir the switch 14 to disconnect the external power source (+5V and +12V) from the outer signal connector 133 and the original inner rack 2 with the USB interface hub therein can be replaced with another inner rack with a USB periphery device such as the flash memory reader. Then, the switch 14 is stirred back to the original position for the external power source (+5V and +12V) being able to connect with the outer signal connector 133 again. In this way, the power source of the computer main unit does not have to be turned off during the inner rack 2 being replaced.

Therefore, it is distinctive from the foregoing that the present invention has arranged both of the IDE interface and the USB interface in a mobile rack and the user can simply insert an inner rack containing a data storage device with IDE interface or a USB periphery device with USB interface into the outer frame to form a close circuit for the selected device running well handily. What's more, the present invention adopts the internal connection type mobile rack and the mobile rack is mounted to the main unit from the front side of the main unit so that the inconvenience resulting from the USB socket being attached to the rear side of the main unit as the conventional art does can be avoided and the puzzle resulting from the external connection type mobile rack occupying the limited space can be eliminated. Furthermore, the USB periphery device in the inner rack can be run immediately without any other driver software as soon as the inner rack is inserted so that it simplifies the steps operated by the user. Besides, the outer and the inner signal connectors provides the same pin designations as the prior art does so that it is not possible to cause the power source (+5V) in a state of short circuit in case of replacing different inner racks and it can secure the main board from damage due to excessive current. Moreover, the present invention can supply the power directly without the need of the assistance of a power supplier, which is required by the conventional USB periphery device.

While the invention has been described with reference to the preferred embodiments thereof, it is to be understood that modifications or variations may be easily made without departing from the spirit of this invention, which is defined by the appended claims.

What is claimed is:

1. A mobile rack with IDE and USB interfaces, comprising:

an outer frame with a rear side, having a central frame chamber;

an outer circuit board with an outer side and an inner side, being attached to the rear side of the outer frame, the outer circuit board having a 40-pin IDE interface connector, a power input socket and a first USB signal connector at the outer side thereof respectively;

a 50-pin outer signal connector disposed at the inner side of and connected to the outer circuit board; a power line between the outer signal connector and a power input socket; a switch on the outer frame for disconnecting/connecting the outer signal connector with an outer power source; +data and −data signals in the first USB signal connector connected with two vacant pins in the outer signal connector and pins in the first signal USB signal connector including a +5V and two ground lines are connected to corresponding pins in the outer signal connector in parallel to enable the outer signal connector to have a IDE interface and a USB interface respectively;

wherein the outer signal connector has following pin designations:

a 1st to a 40th pins are IDE interface signals, a 41st and a 42nd pins are connected to the +data and the −data signals in the USB signal connector respectively, a 43rd and a 44th pins connect with the power input socket and a +5V power source of the USB signal connector in parallel, a 45th and 48th pins for connecting with the power input socket and a grounded line in the first USB signal connector in parallel, and a 49th and a 50th pins for connecting with a +12V power source in parallel;

an inner rack at a rear at a rear side thereof having an inner circuit board with an outer side and an inner side, the outer side having a 50-pin inner signal connector connecting with the 50-pin outer signal connector, the inner side having a circuit to separate a signal as a IDE interface connector, the inner rack further including a power output plug and a second USB signal connector, whereby a data storage device with a IDE interface or a USB periphery device with a USB interface may be mounted in the inner rack and connected to the outer frame via engagement of the 50-pin inner and outer signal connectors;

the inner signal connector has the following pin designation:

a 1st to a 40th pins are IDE interface signals, a 41st and a 42nd pins are +data and −data signals respectively, a 43rd and a 44th pins are +5V power sources in parallel, a 45th and 48th pins are ground lines in parallel, and a 49th and a 50th pins are +12 power sources in parallel.

2. The mobile rack with IDE and USB interfaces as defined in claim 1, further comprising a data storage device with IDE interface mounted in the inner rack and selected from a group consisting of: a hard disk; a ZIP disk drive; a magnetic-optical disk drive; a magnetic tape unit; and a flash memory card read.

3. The mobile rack with IDE and USB interfaces as defined in claim 1, further comprising the USB periphery device with a USB interface mounted in the inner rack and selected from a group consisting of: a USB hub; a 10/100 ethernet card; a television box; a modem; and a flash memory card read.

4. The mobile rack with IDE and USB interfaces as defined in claim 3, wherein a USB signal line connects with the second USB signal connector of the inner circuit board and a USB signal connector of the USB periphery device.

5. The mobile rack with IDE and USB interfaces as defined in claim 1, wherein the inner rack at a top thereof is closed with an upper cover.

6. The mobile rack with IDE and USB interfaces as defined in claim 3, wherein the USB periphery device has a plurality of USB sockets accessible from a front of the inner rack.

* * * * *